US012614594B2

(12) United States Patent
    Park et al.

(10) Patent No.: US 12,614,594 B2
(45) Date of Patent: Apr. 28, 2026

(54) PROGRAMMING COMPLEMENTARY DATA NON-VOLATILE MEMORY DEVICE AND METHOD

(71) Applicant: SAMSUNG ELECTRONICS CO., LTD., Suwon-si (KR)

(72) Inventors: Hyun Ik Park, Yongin-si (KR); Jae Hun Lee, Yongin-si (KR); Chang Min Jeon, Yongin-si (KR); Yong Kyu Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 581 days.

(21) Appl. No.: 17/814,270

(22) Filed: Jul. 22, 2022

(65) Prior Publication Data

US 2023/0170028 A1      Jun. 1, 2023

(30) Foreign Application Priority Data

Dec. 1, 2021     (KR) ........................ 10-2021-0170003

(51) Int. Cl.
    *G11C 16/26*        (2006.01)
    *G11C 16/04*        (2006.01)
    (Continued)

(52) U.S. Cl.
    CPC .......... *G11C 16/26* (2013.01); *G11C 16/0441* (2013.01); *G11C 16/10* (2013.01);
    (Continued)

(58) Field of Classification Search
    CPC ..... G11C 16/26; G11C 16/0441; G11C 16/10; G11C 16/14; G11C 29/789; G11C 16/28;
    (Continued)

(56) References Cited

U.S. PATENT DOCUMENTS 9,025,386 B1    5/2015   Iyer et al.
9,054,209 B2    6/2015   Toh et al.
    (Continued)

OTHER PUBLICATIONS

Faraz Khan et al., "Charge Trap Transistor (CTT): An Embedded Fully Logic-Compatible Multiple-Time Programmable Non-Volatile Memory Element for High-k Metal-Gate CMOS Technologies", IEEE Electron Device Letters ( vol. 38, Issue: 1, Jan. 2017).

*Primary Examiner* — Donald HB Braswell
(74) *Attorney, Agent, or Firm* — MORGAN, LEWIS & BOCKIUS LLP

(57)                ABSTRACT

A non-volatile memory device includes a memory cell which stores one of first data and second data, and includes a first sub-memory cell connected to a first word line and a first bit line, and a second sub-memory cell connected to a second word line and a second bit line, a source line shared by the first sub-memory cell and the second sub-memory cell, and a sense amplifier connected to the first bit line and the second bit line which reads data stored in the memory cell. The sense amplifier receives a first current from the first bit line, receives a second current from the second bit line, and reads data stored in the memory cell by comparing magnitudes of the first current and the second current. The first sub-memory cell is programmed, and the second sub-memory cell is erased, in response to the memory cell storing the first data.

18 Claims, 14 Drawing Sheets

(51) Int. Cl.

| | |
|---|---|
| *G11C 16/10* | (2006.01) |
| *G11C 16/14* | (2006.01) |
| *G11C 29/00* | (2006.01) |
| *H10B 41/40* | (2023.01) |
| *H10B 43/40* | (2023.01) |

(52) U.S. Cl.
CPC ............ *G11C 16/14* (2013.01); *G11C 29/789* (2013.01); *H10B 41/40* (2023.02); *H10B 43/40* (2023.02)

(58) Field of Classification Search
CPC ....... G11C 16/0466; G11C 5/147; G11C 7/18; G11C 8/14; G11C 16/08; G11C 16/24; H10B 41/40; H10B 43/40; H10B 20/20; H10D 30/69
See application file for complete search history.

(56) References Cited

U.S. PATENT DOCUMENTS

| | | | |
|---|---|---|---|
| 9,324,430 B2 | 4/2016 | Chishti et al. | |
| 9,721,673 B1* | 8/2017 | Raghavan | .............. G11C 16/08 |
| 10,395,752 B2 | 8/2019 | Fifield et al. | |
| 10,839,893 B2 | 11/2020 | Du et al. | |
| 2014/0048867 A1 | 2/2014 | Toh et al. | |
| 2015/0318043 A1* | 11/2015 | Chishti | .................. G11C 17/14 |
| | | | 365/185.21 |
| 2019/0108894 A1* | 4/2019 | Fifield | ................ G11C 16/0408 |
| 2020/0105356 A1 | 4/2020 | Kulkarni et al. | |
| 2020/0364548 A1 | 11/2020 | Chang et al. | |
| 2022/0319609 A1* | 10/2022 | Shibaguchi | ............ G11C 16/10 |

* cited by examiner

| | | WL1 | WL2 | BL1 | BL2 | SL | Sub | Operation |
|---|---|---|---|---|---|---|---|---|
| PGM | sel | 1.0~2.0 | 0.0~1.0 | 0.0 | 2.0~3.5 | F | 1.5~3.0 | TR2 ERS |
| | unsel | 0.0 | 0.0 | 2.0~3.5 | 2.0~3.5 | F | 0.0~3.0 | |
| | sel | 1.5~3.0 | 1.0~2.0 | 2.0~4.0 | 0.0 | F | 0.0 | TR1 PGM |
| | unsel | 0.0 | 0.0 | 2.0~4.0 | 2.0~4.0 | F | 0.0 | |
| ERS | sel | 0.0~1.0 | 1.0~2.0 | 2.0~3.5 | 0.0 | F | 1.5~3.0 | TR1 ERS |
| | unsel | 0.0 | 0.0 | 2.0~3.5 | 2.0~3.5 | F | 0.0~3.0 | |
| | sel | 1.0~2.0 | 1.5~3.0 | 0.0 | 2.0~4.0 | F | 0.0 | TR2 PGM |
| | unsel | 0.0 | 0.0 | 2.0~4.0 | 2.0~4.0 | F | 0.0 | |
| Read | sel | 0.0~1.0 | 0.0~1.0 | signal | signal | 0.5~1.5 | 0.0 | |
| | unsel | 0.0 | 0.0 | 0.0 | 0.0 | 0.0 | 0.0 | |

PROGRAMMING COMPLEMENTARY DATA NON-VOLATILE MEMORY DEVICE AND METHOD

CROSS-REFERENCE TO RELATED APPLICATION

This application claims priority under 35 U.S.C. § 119 to Korean Patent Application No. 10-2021-0170003, filed on Dec. 1, 2021 in the Korean Intellectual Property Office, the disclosure of which is incorporated by reference herein in its entirety.

TECHNICAL FIELD

Embodiments of the present disclosure relate to a non-volatile memory device and a method of operating the same.

DISCUSSION OF RELATED ART

Among devices that store data, a device that maintains stored data even if a power supply is cut off is called a non-volatile memory. A non-volatile memory includes, for example, a Read Only Memory (ROM), a magnetic disk, an optical disk, a flash memory, an embedded memory, etc. A One-Time Programmable (OTP) memory is a type of non-volatile memory that may not be changed when data is written once, and a Multi-Time Programmable (MTP) memory is a type of non-volatile memory that may record data more than once. The MTP memory device is widely used as a built-in non-volatile storage device that stores repair, analog trimming, security codes, etc. of other memory devices, and may have a small difference in threshold voltage between on-cell and off-cell.

SUMMARY

Embodiments of the present disclosure provide a non-volatile memory device having increased performance and reliability.

Embodiments of the present disclosure also provide a method of operating a non-volatile memory device having increased performance and reliability.

According to an embodiment of the present disclosure, a non-volatile memory device includes a memory cell which stores one of first data and second data, and includes a first sub-memory cell connected to a first word line and a first bit line, and a second sub-memory cell connected to a second word line and a second bit line, a source line shared by the first sub-memory cell and the second sub-memory cell, and a sense amplifier connected to the first bit line and the second bit line to read data stored in the memory cell. The sense amplifier receives a first current from the first bit line, receives a second current from the second bit line, and compares magnitudes of the first current and the second current to read data stored in the memory cell. The first sub-memory cell is programmed, and the second sub-memory cell is erased, in response to the memory cell storing the first data.

According to an embodiment of the present disclosure, a method of operating a non-volatile memory device includes providing a memory cell which stores one of first data and second data, and includes a first sub-memory cell connected to a first word line and a first bit line, and a second sub-memory cell connected to a second word line and a second bit line, and programming the first sub-memory cell and erasing the second sub-memory cell in response to a command for storing the first data in the memory cell. Programming the first sub-memory cell includes applying a first voltage to the first word line, applying a second voltage different from the first voltage to the second word line, applying a third voltage to the first bit line, and applying a fourth voltage different from the third voltage to the second bit line.

According to an embodiment of the present disclosure, a method of operating a non-volatile memory device includes providing a memory cell which stores first data, and includes first sub-memory cell that is connected to a first word line and a first bit line and programmed, and a second sub-memory cell that is connected to a second word line and a second bit line, shares a source line with the first sub-memory cell and is erased, applying a read word line voltage to the first and second word lines, in response to a read command for reading the first data stored in the memory cell, applying a read bit line voltage to the first and second bit lines, applying a read source line voltage to the source line, receiving a first current from the first bit line, and receiving a second current from the second bit line, and comparing magnitudes of the first current and the second current to read the first data stored in the memory cell. The magnitude of the first current is different from the magnitude of the second current.

BRIEF DESCRIPTION OF THE DRAWINGS

The above and other aspects and features of the present disclosure will become more apparent by describing in detail embodiments thereof with reference to the attached drawings, in which:

FIGS. 8 to 14 are exemplary diagrams for describing a method of operating a non-volatile memory device according to some embodiments.

DETAILED DESCRIPTION OF THE EMBODIMENTS

Figure 1:
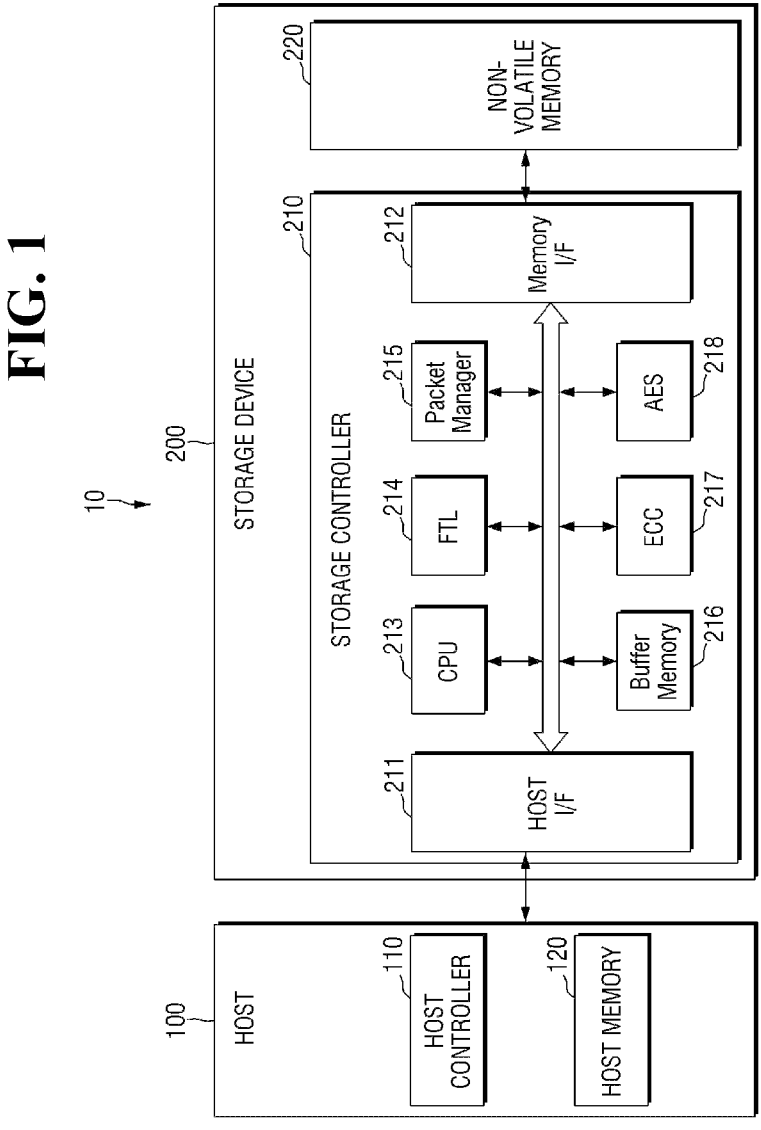
FIG. 1 is a block diagram which shows a host-storage system according to some embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

FIG. 1 is a block diagram which shows a host-storage system according to some embodiments.

The host-storage system 10 may include a host 100 and a storage device 200. The storage device 200 may include a storage controller 210 and a non-volatile memory (NVM) 220. Further, according to an embodiment of the disclosure, the host 100 may include a host controller 110 and a host memory 120. The host memory 120 may function as a buffer memory for temporarily storing the data to be transmitted to the storage device 200 or the data transmitted from the storage device 200.

The storage device 200 may include a storage medium for storing data in response to a request from the host 100. As an example, the storage device 200 may include at least one of a Solid State Drive (SSD), an embedded memory, and a detachable external memory. When the storage device 200 is the SSD, the storage device 200 may be a device that complies with a non-volatility memory express (NVMe) standard. When the storage device 200 is an embedded memory or an external memory, the storage device 200 may be a device that complies with a universal flash storage (UFS) or an embedded multi-media card (eMMC) standard. The host 100 and the storage device 200 may each generate and transmit packets according to the adopted standard protocol.

When the non-volatile memory 220 of the storage device 200 includes a flash memory, the flash memory may include a 2D NAND memory array or a 3D (or vertical) NAND (VNAND) memory array.

As another example, the storage device 200 may include different various types of non-volatile memories. For example, a Magnetic RAM (MRAM), a spin-transfer torque MRAM, a conductive bridging RAM (CBRAM), a Ferroelectric RAM (FeRAM), a Phase RAM (PRAM), a resistive memory (Resistive RAM), and various other types of memories may be adopted as the storage device 200.

According to an embodiment, the host controller 110 and the host memory 120 may be implemented as separate semiconductor chips. Further, in some embodiments, the host controller 110 and the host memory 120 may be integrated on the same semiconductor chip. As an example, the host controller 110 may be any one of a plurality of modules provided in the application processor, and the application processor may be implemented as a system on chip (SoC). Further, the host memory 120 may be an embedded memory provided inside the application processor, or a non-volatile memory or a memory module placed outside the application processor.

The host controller 110 may manage an operation of storing the data (for example, write data) of a buffer region in the non-volatile memory 220 or storing the data (for example, read data) of the non-volatile memory 220 in the buffer region.

The storage controller 210 may include a host interface 211, a memory interface 212, and a central processing unit (CPU) 213. The storage controller 210 may further include a flash translation layer (FTL) 214, a packet manager 215, a buffer memory 216, an error correction code (ECC) engine 217, and an advanced encryption standard (AES) engine (218). The storage controller 210 may further include a working memory into which the flash translation layer (FTL) 214 is loaded. When the CPU 213 executes the flash translation layer 214, the data write and read operations on the non-volatile memory may be controlled.

The host interface 211 may transmit and receive packets to and from the host 100. The packets transmitted from the host 100 to the host interface 211 may include, for example, a command, data to be written in the non-volatile memory 220, etc. The packets transmitted from the host interface 211 to the host 100 may include, for example, a response to the command, data that is read from the non-volatile memory 220, etc. The memory interface 212 may transmit the data to be written in the non-volatile memory 220 to the non-volatile memory 220 or receive the data that is read from the non-volatile memory 220. Such a memory interface 212 may be implemented to comply with standard protocols such as, for example, Toggle or ONFI.

The flash translation layer 214 may perform various functions such as, for example, address mapping, wear-leveling, and garbage collection. The address mapping operation is an operation of changing a logical address received from a host into a physical address which is used for storing the data in the non-volatile memory 220. The wear-leveling is a technique for ensuring that blocks in the non-volatile memory 220 are used uniformly to prevent an excessive degradation of a particular block, and may be implemented, for example, through a firmware technique for balancing the erasure counts of the physical blocks. The garbage collection is a technique for ensuring an available capacity in the non-volatile memory 220 through a method of copying the valid data of the block to a new block and then erasing the existing block.

The packet manager 215 may generate a packet according to the protocol of the interface discussed with the host 100, or may parse various types of information from the packet received from the host 100. Further, the buffer memory 216 may temporarily store the data to be written in the non-volatile memory 220 or the data to be read from the non-volatile memory 220. The buffer memory 216 may be configured to be provided inside the storage controller 210, but may be placed outside the storage controller 210.

The ECC engine 217 may perform error detection and correction functions on the read data that is read from the non-volatile memory 220. For example, the ECC engine 217 may generate parity bits for the write data to be written on the non-volatile memory 220, and the parity bits thus generated may be stored in the non-volatile memory 220 together with the write data. When reading the data from the non-volatile memory 220, the ECC engine 217 may correct errors of the read data, using the parity bits that are read from the non-volatile memory 220, together with the read data, and may output the read data with corrected errors.

The AES engine 218 may perform at least one of an encryption operation and a decryption operation on the data which is input to the storage controller 210, u sing a symmetric-key algorithm.

Figure 2:
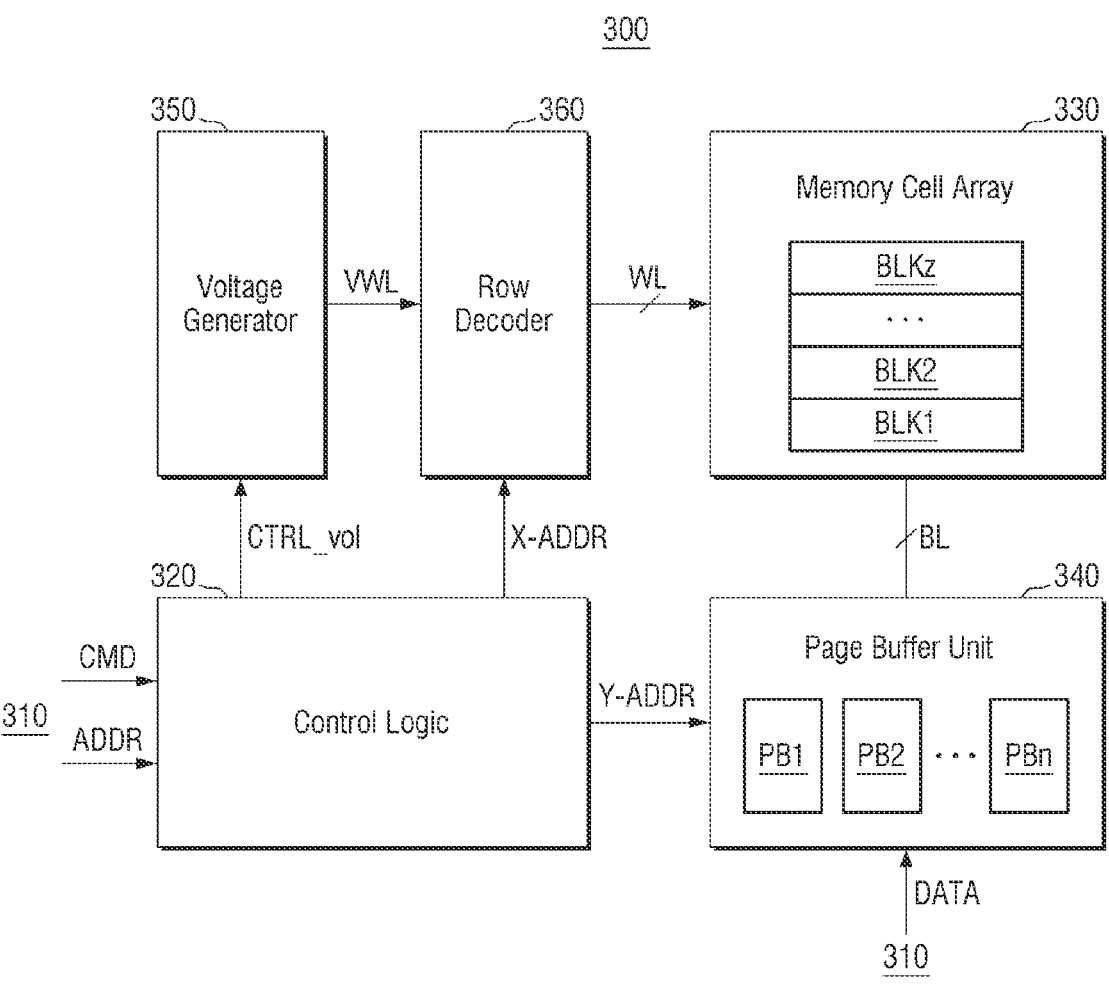
FIG. 2 is an exemplary block diagram showing a non-volatile memory device according to some embodiments.

FIG. 2 is an exemplary block diagram showing a non-volatile memory device according to some embodiments.

Referring to FIG. 2, a non-volatile memory device 300 according to some embodiments may include a control logic circuit 320, a memory cell array 330, a page buffer unit 340, a voltage generator 350, and a row decoder 360. In an embodiment, the non-volatile memory device 300 may further include a memory interface circuit 310, and may further include, for example, a column logic, a pre-decoder, a temperature sensor, a command decoder, an address decoder, etc.

The control logic circuit 320 may generally control various operations inside the non-volatile memory device 300. The control logic circuit 320 may output various control signals in response to the command CMD and/or the address ADDR from the memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (z is a positive integer). Each of the plurality of memory blocks BLK1 to BLKz may include a plurality of memory cells (e.g., 400 of FIG. 3). The memory cell array 330 may be connected to the page buffer unit 340 through bit lines BL, and may be connected to the row decoder 360 through word lines WL.

The page buffer unit 340 may include a plurality of page buffers PB1 to PBn (n is an integer of 3 or more), and each of the plurality of page buffers PB1 to PBn may be connected to the memory cells through a plurality of bit lines BL. The page buffer unit 340 may select at least one bit line among the bit lines BL in response to the column address Y-ADDR. The page buffer unit 340 may operate as a write driver or a detection amplifier (e.g., 500 of FIG. 3), depending on the operating mode.

For example, at the time of the program operation, the page buffer unit 340 may apply a bit line voltage corresponding to the data to be programmed to the selected bit line. At the time of the read operation, the page buffer unit 340 may detect the current or voltage of the selected bit line and detect the data stored in the memory cell.

The voltage generator 350 may generate various types of voltages for performing program, read, and erase operations on the basis of the voltage control signal CTRL_vol. For example, the voltage generator 350 may generate a program voltage, a read word line voltage, a program verification voltage, an erase voltage, etc., as a word line voltage VWL.

The row decoder 360 may select one of a plurality of word lines WL in response to the row address X-ADDR. For example, the row decoder 360 may apply a program voltage and a program verification voltage to the selected word line at the time of the program operation, and may apply a read word line voltage to the selected word line at the time of the read operation.

Figure 3:
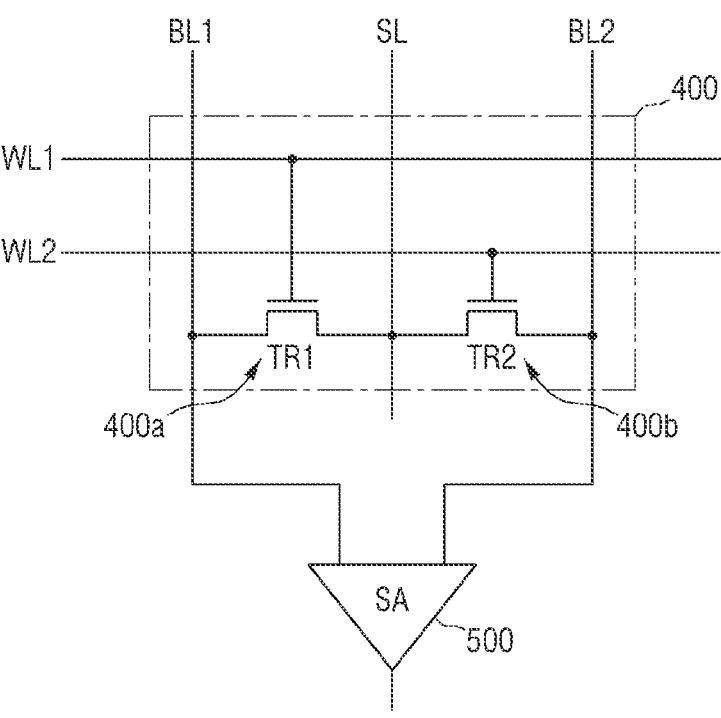
FIG. 3 is an exemplary circuit diagram for describing a memory cell of a non-volatile memory device according to some embodiments.

FIG. 3 is an exemplary circuit diagram for describing a memory cell of a non-volatile memory device according to some embodiments.

Referring to FIG. 3, the non-volatile memory device according to some embodiments may include a first word line WL1, a second word line WL2, a first bit line BL1, a second bit line BL2, a source line SL, a memory cell 400, and a sense amplifier 500.

The memory cell 400 may include a first sub-memory cell 400a and a second sub-memory cell 400b. The first sub-memory cell 400a may include a first transistor TR1, and the second sub-memory cell 400b may include a second transistor TR2. Although the first transistor TR1 and the second transistor TR2 may be, for example, an n-type metal-oxide semiconductor (NMOS) transistor, embodiments of the present disclosure are not limited thereto.

In some embodiments, the first sub-memory cell 400a and the second sub-memory cell 400b may be, for example, the multi-time programmable (MTP) memory.

In some embodiments, the first sub-memory cell 400a may be connected to the first word line WL1 and the first bit line BL1. The second sub-memory cell 400b may be connected to the second word line WL2 and the second bit line BL2. The first sub-memory cell 400a and the second sub-memory cell 400b may share a source line SL. For example, the first bit line BL1 may be connected to one end of the first transistor TR1, and the source line SL may be connected to the other end of the first transistor TR1. The second bit line BL2 may be connected to one end of the second transistor TR2, and the source line SL may be connected to the other end of the second transistor TR2.

In some embodiments, the first word line WL1 may be connected to a gate end of the first transistor TR1. The second word line WL2 may be connected to a gate end of the second transistor TR2.

The sense amplifier 500 may be connected to the first bit line BL1 and the second bit line BL2. In some embodiments, the sense amplifier 500 and the source line SL are not connected to each other. As an example, the sense amplifier 500 may receive the first current from the first bit line BL1, and receive the second current from the second bit line BL2. The sense amplifier 500 may read the data stored in the memory cell 400 by comparing the magnitudes of the first current and the second current. As another example, the sense amplifier 500 may receive a first bit line voltage from the first bit line BL1 and receive a second bit line voltage from the second bit line BL2. The sense amplifier 500 may read the data stored in the memory cell 400 by comparing the magnitudes of the first bit line voltage and the second bit line voltage.

The memory cell 400 may store either the first data or the second data. The first data may be, for example, '1' and the second data may be, for example, '0', but are not limited thereto.

In some embodiments, in response to the memory cell 400 storing the first data, the first sub-memory cell 400a may be programmed, and the second sub-memory cell 400*b* may be erased. In response to the memory cell 400 storing the second data, the first sub-memory cell 400*a* may be erased and the second sub-memory cell 400*b* may be programmed.

For example, when programming the first sub-memory cell 400*a*, the first voltage may be applied to the first word line WL1 and the second voltage may be applied to the second word line WL2. The first voltage and the second voltage may be different from each other. Similarly, when erasing the second sub-memory cell 400*b*, different voltages may be applied to the first word line WL1 and the second word line WL2.

In this way, in the non-volatile memory device according to some embodiments, the first sub-memory cell 400*a* and the second sub-memory cell 400*b* may operate in a reverse manner. The sensing margin of the sense amplifier 500 may be increased by programming the first sub-memory cell 400*a* and erasing the second sub-memory cell 400*b*. Alternatively, the sensing margin of the sense amplifier 500 may be increased by erasing the first sub-memory cell 400*a* and programming the second sub-memory cell 400*b*. A specific operating method of the memory cell 400 will be described in detail below with reference to FIGS. 8 to 14.

Figure 4:
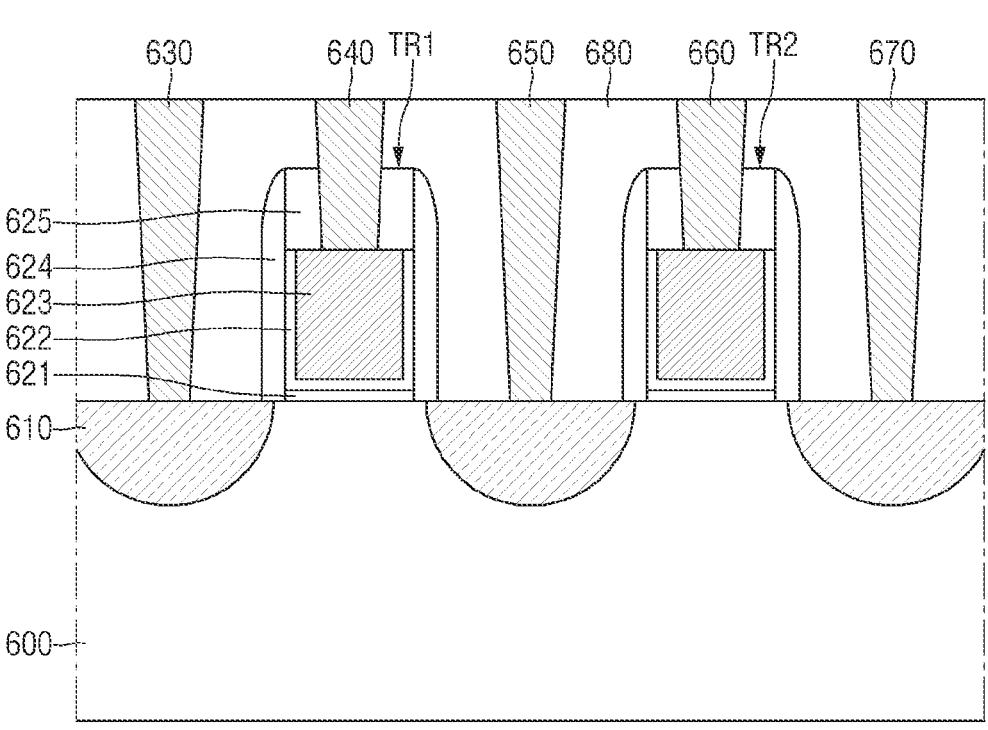
FIG. 4 is an exemplary cross-sectional view of a non-volatile memory device according to some embodiments.

FIG. 4 is an exemplary cross-sectional view of a non-volatile memory device according to some embodiments.

Referring to FIG. 4, the non-volatile memory device according to some embodiments may include a substrate 600, a first transistor TR1, a second transistor TR2, a source/drain region 610, a first contact 630, a second contact 640, a third contact 650, a fourth contact 660, a sixth contact 670, and an interlayer insulating film 680.

The substrate 600 may be, for example, a silicon substrate or a silicon-on-insulator (SOI), and may include, for example, silicon germanium, silicon germanium on insulator (SGOI), indium antimonide, lead tellurium compounds, indium arsenic, indium phosphide, gallium arsenide or gallium antimonide.

The first transistor TR1 and the second transistor TR2 may be placed on the substrate 600. The first transistor TR1 may be a transistor of the first sub-memory cell 400*a*, and the second transistor TR2 may be a transistor of the second sub-memory cell 400*b*. In FIG. 4, although each of the first transistor TR1 and the second transistor TR2 is a planar transistor, embodiments are not limited thereto.

Each of the first transistor TR1 and the second transistor TR2 may include an interface film 621, a high dielectric constant film 622, a gate electrode 623, a gate spacer 624, and a gate capping pattern 625. As an example, each of the first transistor TR1 and the second transistor TR2 may be a transistor of an MTP memory including the high dielectric constant film 622.

The interface film 621 may be placed on an upper side of the substrate 600. The interface film 621 is placed between the substrate 600 and the high dielectric constant film 622. The interface film 621 may include, for example, a silicon oxide.

The high dielectric constant film 622 may be placed on the interface film 621. The high dielectric constant film 622 may be formed between the interface film 621 and the gate electrode 623. The high dielectric constant film 622 may include a high dielectric constant material having a higher dielectric constant than that of silicon oxide. The high dielectric constant film 622 may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The gate electrode 623 may be placed on the high dielectric constant film 622. The high dielectric constant film 622 may extend along the side walls and bottom surface of the gate electrode 623. The gate electrode 623 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The gate electrode 623 may include, for example, a conductive metal oxide, a conductive metal oxynitride, etc., or may include an oxidized form of the above-mentioned materials.

The gate spacer 624 may be placed on the side walls of the gate electrode 623. The gate spacer 624 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and a combination thereof.

The gate capping pattern 625 may be placed on the gate electrode 623. The gate capping pattern 625 may include, for example, at least one of silicon nitride (SiN), silicon oxynitride (SiON), silicon oxide (SiO$_2$), silicon carbonitride (SiCN), silicon oxycarbonitride (SiOCN), and a combination thereof.

The source/drain region 610 may be formed inside the substrate 600. The source/drain region 610 may be placed on both side surfaces of the first transistor TR1 and the second transistor TR2. For example, a part of the source/drain region 610 may be placed on one side surface of the first transistor TR1, another part of the source/drain region 610 may be placed between the first transistor TR1 and the second transistor TR2, and another part of the source/drain region 610 may be placed on one side surface of the second transistor TR2.

The first contact 630, the third contact 650, and the fifth contact 670 may each be connected to the source/drain region 610. The second contact 640 and the fourth contact 660 may each be connected to the gate electrode 623. The first to fifth contacts 630, 640, 650, 660, and 670 may include, for example, tungsten.

The interlayer insulating film 680 may be placed on the substrate 600. The interlayer insulating film 680 may include, for example, silicon oxide.

In some embodiments, the gate electrode 623 of the first transistor TR1 may be connected to the first word line (WL1 of FIG. 3). The gate electrode 623 of the second transistor TR2 may be connected to the second word line (WL2 of FIG. 3). For example, the first word line WL1 and the gate electrode 623 of the first transistor TR1 may be connected to each other through the second contact 640. The second word line WL2 and the gate electrode 623 of the second transistor TR2 may be connected to each other through the fourth contact 660.

In some embodiments, the first bit line (BL1 of FIG. 3), the second bit line (BL2 of FIG. 3), and the source line (SL of FIG. 3) may be connected to the source/drain region 610. For example, the first bit line BL1 and the source/drain region 610 may be connected to each other through the first contact 630. The second bit line BL2 and the source/drain region 610 may be connected to each other through the fifth contact 670. The source line SL and the source/drain region 610 may be connected to each other through a third contact 650.

In some embodiments, the first transistor TR1 and the second transistor TR2 may be, for example, a charge trap transistor (CTT) including the high dielectric constant film 622.

Figure 5:
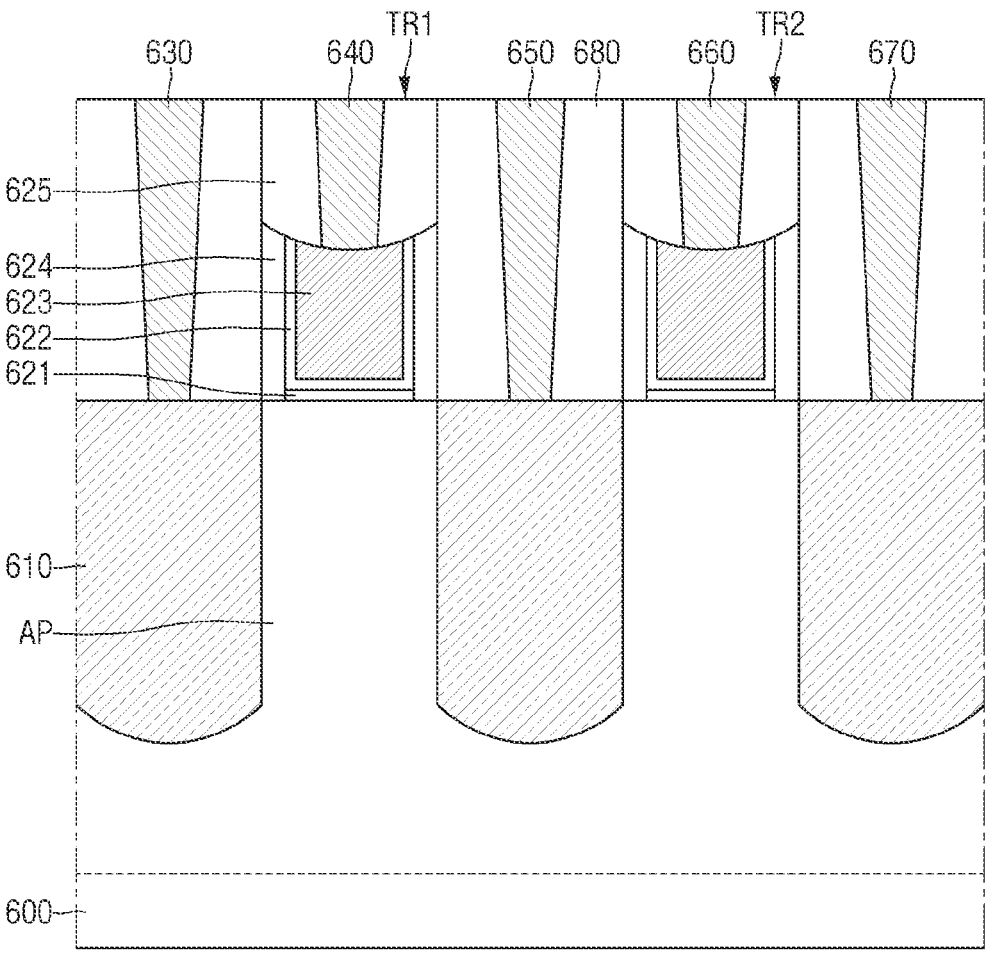
FIG. 5 is an exemplary cross-sectional view of a non-volatile memory device according to some embodiments.

FIG. 5 is an exemplary cross-sectional view of a non-volatile memory device according to some embodiments.

Referring to FIG. 5, the first transistor TR1 and the second transistor TR2 according to some embodiments may be fin-type transistors.

In some embodiments, an active pattern AP may be placed on the substrate 600. The active pattern AP may be placed between the source/drain regions 610. In some embodiments, the active pattern AP may extend in one direction. The active pattern AP and the gate electrode 623 may intersect each other. That is, the direction in which the active pattern AP extends may intersect the direction in which the gate electrode 623 extends.

Figure 6:
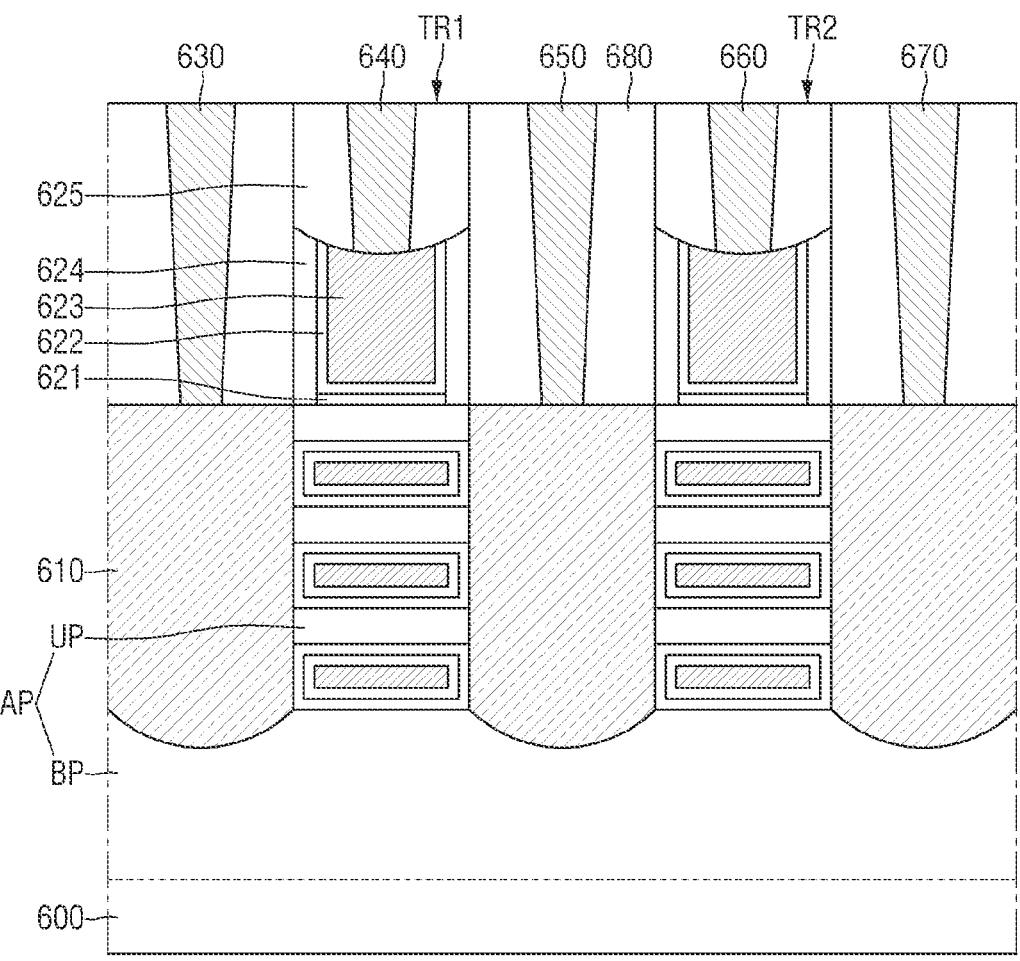
FIG. 6 is an exemplary cross-sectional view of a non-volatile memory device according to some embodiments.

FIG. 6 is an exemplary cross-sectional view of a non-volatile memory device according to some embodiments.

Referring to FIG. 6, the first transistor TR1 and the second transistor TR2 according to some embodiments may be a multi-channel bridge transistor MBCFET.

The active pattern AP may include a lower pattern BP and a sheet pattern UP. The lower pattern BP may be placed on the substrate 600. The sheet pattern UP may be placed on lower pattern BP. The sheet pattern UP may be placed between the source/drain regions 610. The sheet pattern UP may be one of a plurality of sheet patterns UP. The respective sheet patterns UP may be spaced apart from each other. Although three sheet patterns UP are shown in FIG. 6, this is merely for convenience of explanation, and embodiments of the present disclosure are not limited thereto.

In some embodiments, the gate electrode 623, the high dielectric constant film 622, and the interface film 621 may be placed between the source/drain regions 610. The high dielectric constant film 622 may wrap the gate electrode 623. The interface film 621 may wrap the high dielectric constant film 622.

Figure 7:
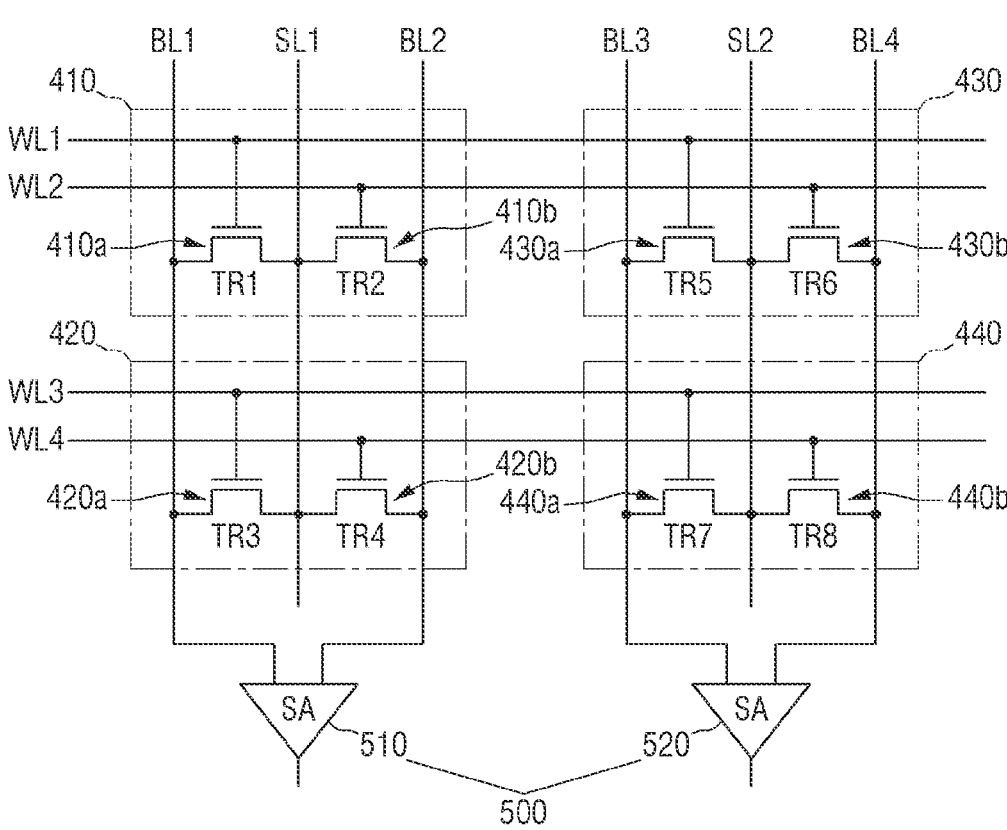
FIG. 7 is an exemplary circuit diagram of a non-volatile memory device according to some embodiments.

FIG. 7 is an exemplary circuit diagram of a non-volatile memory device according to some embodiments.

Referring to FIG. 7, the memory cell 400 according to some embodiments may include a first memory cell 410, a second memory cell 420, a third memory cell 430, and a fourth memory cell 440.

The first memory cell 410 may include a first sub-memory cell 410a and a second sub-memory cell 410b. The first sub-memory cell 410a is connected to the first word line WL1 and the first bit line BL1. The second sub-memory cell 410b is connected to the second word line WL2 and the second bit line BL2.

The second memory cell 420 may include a third sub-memory cell 420a and a fourth sub-memory cell 420b. The third sub-memory cell 420a is connected to the third word line WL3 and the first bit line BL1. The fourth sub-memory cell 420b is connected to the fourth word line WL4 and the second bit line BL2.

The third memory cell 430 may include a fifth sub-memory cell 430a and a sixth sub-memory cell 430b. The fifth sub-memory cell 430a is connected to the first word line WL1 and the third bit line BL3. The sixth sub-memory cell 430b is connected to the second word line WL2 and the fourth bit line BL4.

The fourth memory cell 440 may include a seventh sub-memory cell 440a and an eighth sub-memory cell 440b. The seventh sub-memory cell 440a is connected to the third word line WL3 and the third bit line BL3. The eighth sub-memory cell 440b is connected to the fourth word line WL4 and the fourth bit line BL4.

In some embodiments, the first sub-memory cell 410a and the second sub-memory cell 410b share the first source line SL1. The third sub-memory cell 420a and the fourth sub-memory cell 420b share the first source line SL1. The fifth sub-memory cell 430a and the sixth sub-memory cell 430b share the second source line SL2. The seventh sub-memory cell 440a and the eighth sub-memory cell 440b share the second source line SL2.

In some embodiments, the sense amplifier 500 may include a first sense amplifier 510 and a second sense amplifier 520. The first sense amplifier 510 is connected to the first bit line BL1 and the second bit line BL2. The first sense amplifier 510 is not connected to the first source line SL1. The second sense amplifier 520 is connected to the third bit line BL3 and the fourth bit line BL4. The second sense amplifier 520 is not connected to the second source line SL2.

The first sense amplifier 510 may receive the first current from the first bit line BL1 and receive the second current from the second bit line BL2. The first sense amplifier 510 may read the data stored in the first memory cell 410 or the second memory cell 420, by comparing the magnitude of the first current with the magnitude of the second current. The second sense amplifier 520 may receive the third current from the third bit line BL3 and receive the fourth current from the fourth bit line BL4. The second sense amplifier 520 may read the data stored in the third memory cell 430 or the fourth memory cell 440 by comparing the magnitude of the third current with the magnitude of the fourth current.

The first sense amplifier 510 may receive the first bit line voltage from the first bit line BL1 and receive the second bit line voltage from the second bit line BL2. The first sense amplifier 510 may read the data stored in the first memory cell 410 or the second memory cell 420 by comparing the magnitude of the first bit line voltage with the magnitude of the second bit line voltage. The second sense amplifier 520 may receive the third bit line voltage from the third bit line BL3 and receive the fourth bit line voltage from the fourth bit line BL4. The second sense amplifier 520 may read the data stored in the third memory cell 430 or the fourth memory cell 440 by comparing the magnitude of the third bit line voltage with the magnitude of the fourth bit line voltage.

The first to fourth memory cells 410, 420, 430, and 440 may store the first data or the second data. In response to the first memory cell 410 storing the first data, the first sub-memory cell 410a is programmed and the second sub-memory cell 410b may be erased. In response to the second memory cell 420 storing the first data, the third sub-memory cell 420a is programmed and the fourth sub-memory cell 420b may be erased. In response to the third memory cell 430 storing the first data, the fifth sub-memory cell 430a is programmed and the sixth sub-memory cell 430b may be erased. In response to the fourth memory cell 440 storing the first data, the seventh sub-memory cell 440*a* is programmed and the eighth sub-memory cell 440*b* may be erased.

In response to the first memory cell 410 storing the second data, the first sub-memory cell 410*a* may be erased and the second sub-memory cell 410*b* may be programmed. In response to the second memory cell 420 storing the second data, the third sub-memory cell 420*a* may be erased and the fourth sub-memory cell 420*b* may be programmed. In response to the third memory cell 430 storing the second data, the fifth sub-memory cell 430*a* may be erased and the sixth sub-memory cell 430*b* may be programmed. In response to the fourth memory cell 440 storing the second data, the seventh sub-memory cell 440*a* may be erased and the eighth sub-memory cell 440*b* may be programmed.

In this way, one of the two sub-memory cells included in the memory cell may be programmed and the other memory cell may be erased. As a result, the sensing margin of the memory cell can be increased accordingly.

Hereinafter, a method of operating a non-volatile memory device according to some embodiments will be described with reference to FIGS. 8 to 14.

FIGS. 8 to 14 are exemplary diagrams for describing a method of operating a non-volatile memory device according to some embodiments.

Figure 9:
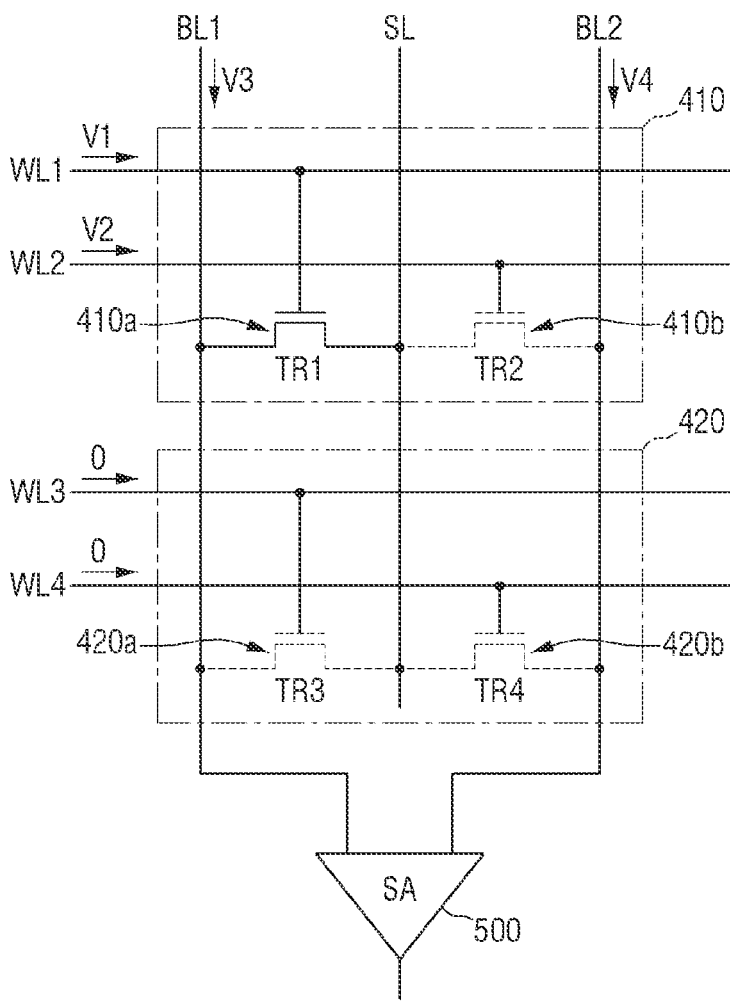
Figure 10:
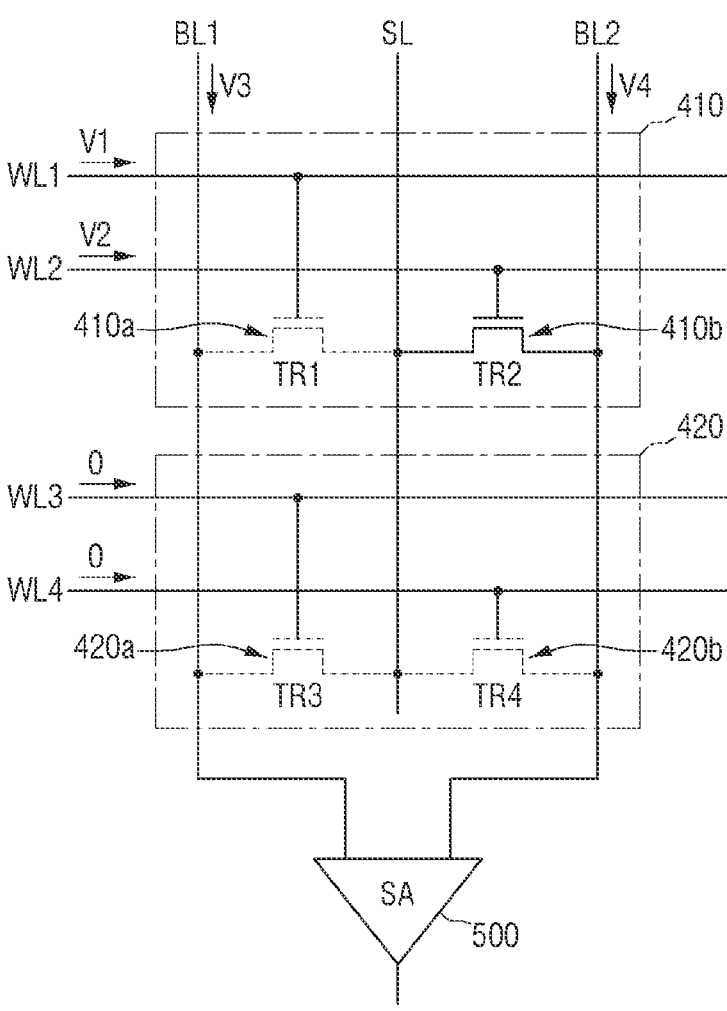
Figure 11:
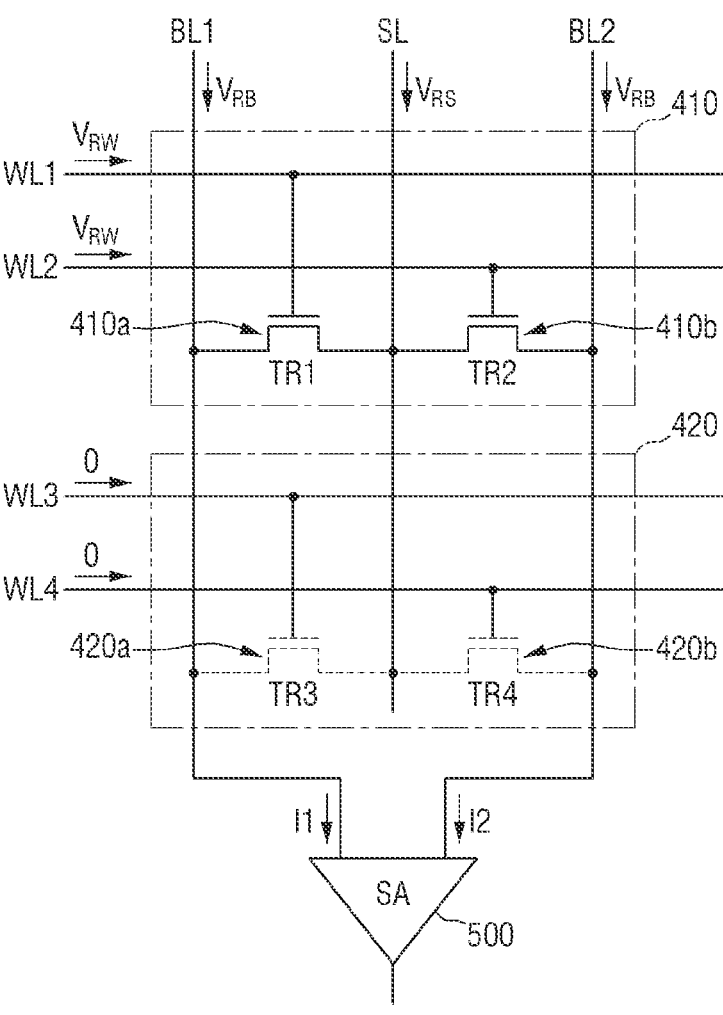
Figure 12:
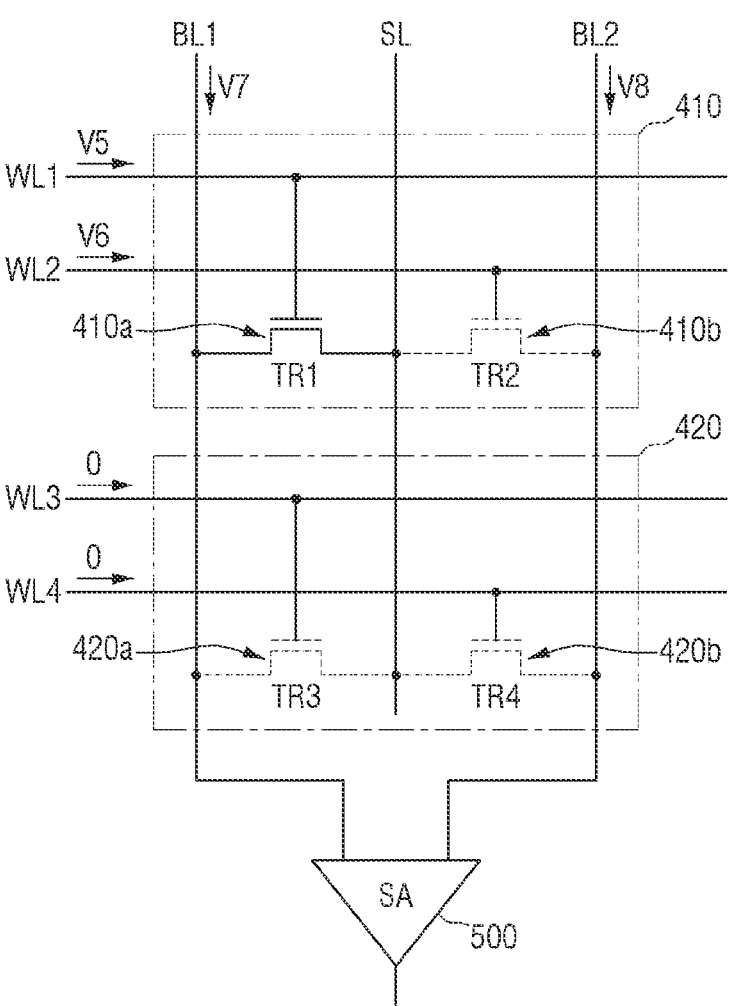
Figure 13:
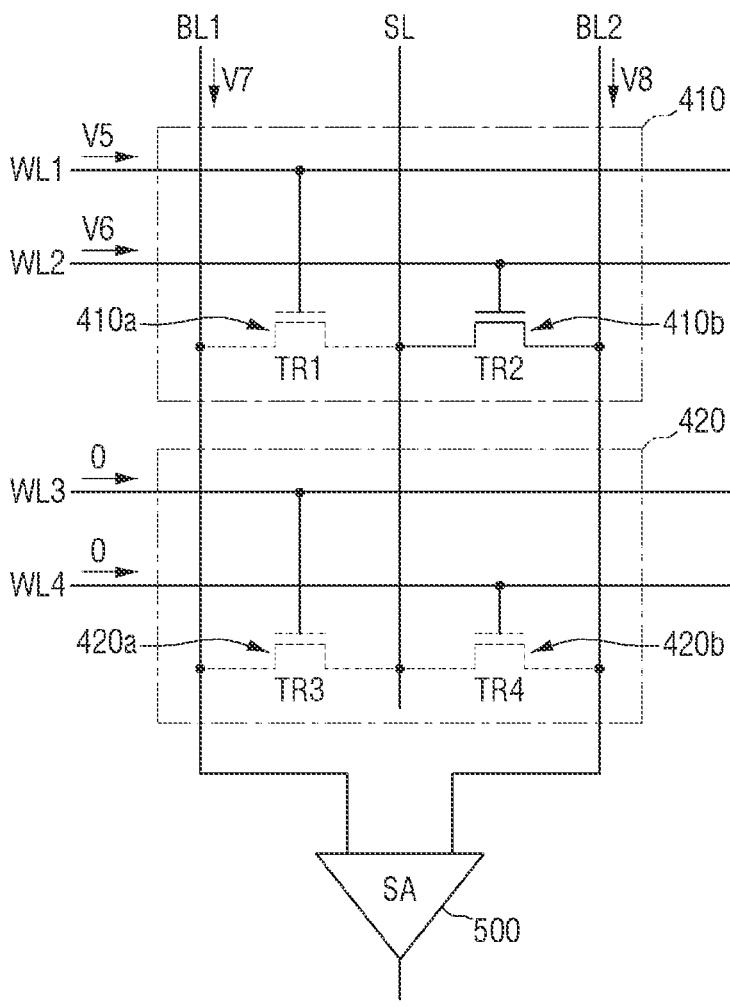
Figure 14:
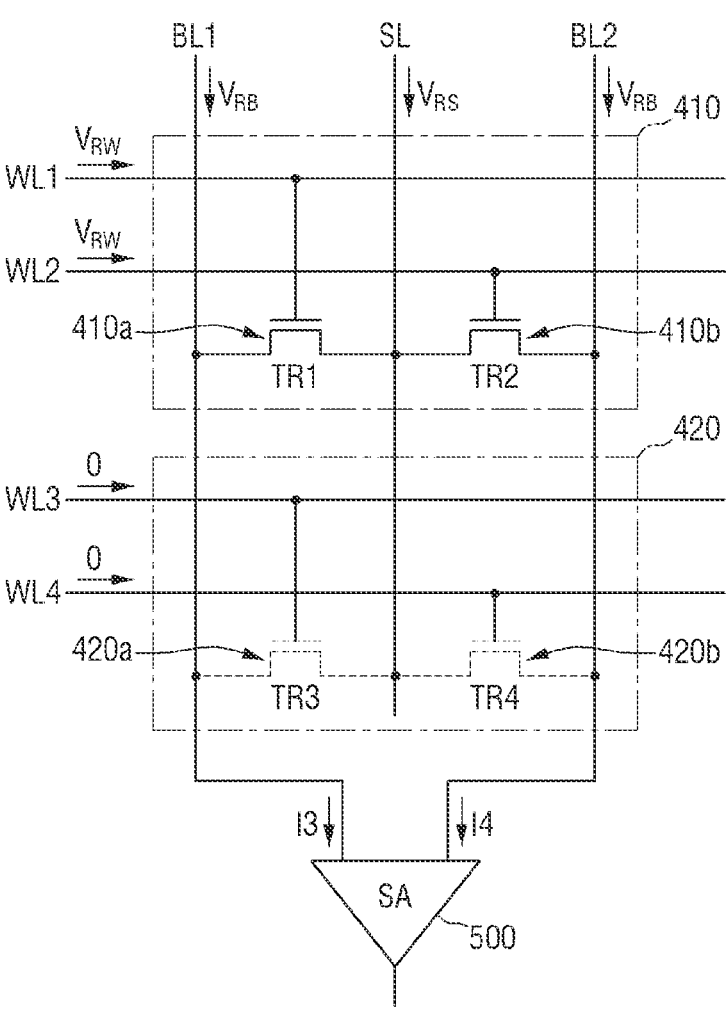

For reference, FIG. 8 is exemplary data for describing the method of operating the non-volatile memory device according to some embodiments. FIGS. 9 and 10 are circuit diagrams for describing the program operation of the first memory cell. FIG. 11 is a circuit diagram for describing a read operation of the first data of the first memory cell. FIGS. 12 and 13 are circuit diagrams for describing an erase operation of the first memory cell. FIG. 14 is a circuit diagram for describing a read operation of the second data of the first memory cell.

Referring to FIGS. 8 to 14, a first memory cell 410, a second memory cell 420, and a sense amplifier 500 are provided.

The first memory cell 410 includes a first sub-memory cell 410*a* and a second sub-memory cell 410*b*. The first sub-memory cell 410*a* is connected to the first word line WL1 and the first bit line BL1. The second sub-memory cell 410*b* is connected to the second word line WL2 and the second bit line BL2. The second memory cell 420 includes a third sub-memory cell 420*a* and a fourth sub-memory cell 420*b*. The third sub-memory cell 420*a* is connected to the third word line WL3 and the first bit line BL1. The fourth sub-memory cell 420*b* is connected to the fourth word line WL4 and the second bit line BL2.

The sense amplifier 500 is connected to the first bit line BL1 and the second bit line BL2. The sense amplifier 500 is not connected to the source line SL. The source line SL is shared by the first sub-memory cell 410*a* and the second sub-memory cell 410*b*. The source line SL is shared by the third sub-memory cell 420*a* and the fourth sub-memory cell 420*b*.

Referring to FIGS. 8 to 10, a first voltage V1 may be applied to the first word line WL1 and a second voltage V2 may be applied to the second word line WL2 in response to a command for selecting the first memory cell 410. A ground voltage may be applied to the first word line WL1 and the second word line WL2 in response to a command for not selecting the second memory cell 420.

One of the first data and the second data may be stored in the first memory cell 410. For example, the first data may be ' 1' and the second data may be '0'.

The first sub-memory cell 410*a* may be programmed and the second sub-memory cell 410*b* may be erased in response to a command for storing the first data in the first memory cell 410. At this time, the source line SL may float.

For example, the first voltage V1 is applied to the first word line WL1, the second voltage V2 is applied to the second word line WL2, the third voltage V3 is applied to the first bit line BL1, and the fourth voltage V4 may be applied to the second bit line BL2. The first voltage V1 may be different from the second voltage V2. The third voltage V3 may be different from the fourth voltage V4.

For example, referring to FIGS. 8 and 9, when programming the first sub-memory cell 410*a*, the first voltage V1 may be about 1.5V or more and about 3.0V or less. The second voltage V2 may be about 1.0V or more and about 2.0V or less. The third voltage V3 may be about 2.0V or more and about 4.0V or less. The fourth voltage V4 may be about 0.0V. That is, programming of the first sub-memory cell 410*a* may include grounding of the second bit line BL2. At this time, a voltage of about 0.0V may be applied to the substrate. However, embodiments of the present disclosure are not limited thereto.

When the voltages are applied to the first word line WL1, the second word line WL2, the first bit line BL1, the second bit line BL2 and the substrate, the electric charge may be trapped in the first transistor TR1. As a result, the first sub-memory cell 410*a* may be programmed.

Referring to FIGS. 8 and 10, when erasing the second sub-memory cell 410*b*, the first voltage V1 may be about 1.0V or more and about 2.0V or less. The second voltage V2 may be about 0.0V or more and about 1.0V or less. The third voltage V3 may be about 0.0V. The fourth voltage V4 may be about 2.0V or more and about 3.5V or less. That is, erasing of the second sub-memory cell 410*b* may include grounding of the first bit line BL1. At this time, a voltage of about 1.5V or more and about 3.0V or less may be applied to the substrate. However, embodiments of the present disclosure are not limited thereto.

When the voltages are applied to the first word line WL1, the second word line WL2, the first bit line BL1, the second bit line BL2 and the substrate, the second sub-memory cell 410*b* may be erased.

Next, referring to FIGS. 8 and 11, the non-volatile memory device according to some embodiments may respond to a read command for reading the first data stored in the first memory cell 410.

For example, a word line read voltage $V_{RW}$ may be applied to the first word line WL1 and the second word line WL2. A bit line read voltage $V_{RB}$ may be applied to the first bit line BL1 and the second bit line BL2. A source line read voltage $V_{RS}$ may be applied to the source line SL.

The word line read voltage $V_{RW}$ may be, for example, about 0.0V or more and about 1.0V or less. The source line read voltage $V_{RS}$ may be, for example, about 0.5V or more and about 1.5V or less. However, embodiments of the present disclosure are not limited thereto.

In this case, a first current $I_1$ may flow through the first bit line BL1. A second current $I_2$ may flow through the second bit line BL2. The sense amplifier 500 may receive the first current $I_1$ and the second current $I_2$. The sense amplifier 500 may read the first data stored in the first memory cell 410 by comparing the magnitudes of the first current $I_1$ and the second current $I_2$. The magnitude of the first current $I_1$ and the magnitude of the second current $I_2$ may be different from each other.

For example, when the magnitude of the first current $I_1$ is smaller than the magnitude of the second current $I_2$, the sense amplifier 500 may read the first data stored in the first memory cell 410.

In some embodiments, the sense amplifier 500 may receive the first bit line voltage from the first bit line BL1 and receive the second bit line voltage from the second bit line BL2. The sense amplifier 500 may read the first data stored in the first memory cell 410 by comparing the magnitudes of the first bit line voltage and the second bit line voltage.

For example, when the magnitude of the first bit line voltage is smaller than the magnitude of the second bit line voltage, the sense amplifier 500 may read the first data stored in the first memory cell 410.

Since the first sub-memory cell 410a is programmed and the second sub-memory cell 410b is erased, the sensing margin of the sense amplifier 500 may be increased. Further, according to some embodiments of the present disclosure, the first memory cell 410 and the second memory cell 420 may be fabricated even when not adding a mask pattern separately.

Referring to FIGS. 8, 12, and 13, a fifth voltage V5 is applied to the first word line WL1, and a sixth voltage V6 may be applied to the second word line WL2, in response to a command for selecting the first memory cell 410. A ground voltage may be applied to the first word line WL1 and the second word line WL2 in response to a command for not selecting the second memory cell 420.

Either the first data or the second data may be stored in the first memory cell 410. For example, the first data may be ' 1' and the second data may be '0'.

The first sub-memory cell 410a may be erased and the second sub-memory cell 410b may be programmed in response to a command for storing the second data in the first memory cell 410. At this time, the source line SL may float.

For example, a fifth voltage V5 is applied to the first word line WL1, a sixth voltage V6 is applied to the second word line WL2, a seventh voltage V7 is applied to the first bit line BL1, and an eighth voltage V8 may be applied to the second bit line BL2. The fifth voltage V5 may be different from the sixth voltage V6. The seventh voltage V7 may be different from the eighth voltage V8.

For example, referring to FIGS. 8 and 12, when erasing the first sub-memory cell 410a, the fifth voltage V5 may be about 0.0V or more and about 1.0V or less. The sixth voltage V6 may be about 1.0V or more and about 2.0V or less. The seventh voltage V7 may be about 2.0V or more and about 3.5V or less. The eighth voltage V8 may be about 0V. That is, erasing of the first sub-memory cell 410a may include grounding of the second bit line BL2. At this time, a voltage of about 1.5V or more and about 3.0V or less may be applied to the substrate. However, embodiments of the present disclosure are not limited thereto.

When the voltages are applied to the first word line WL1, the second word line WL2, the first bit line BL1, the second bit line BL2 and the substrate, the first sub-memory cell 410a may be erased.

Referring to FIGS. 8 and 13, when programming the second sub-memory cell 410b, the fifth voltage V5 may be about 1.0V or more and about 2.0V or less. The sixth voltage V6 may be about 1.5V or more and about 3.0V or less. The seventh voltage V7 may be about 0.0V. The eighth voltage V8 may be about 2.0V or more and about 4.0V or less. That is, programming of the second sub-memory cell 410b may include grounding of the first bit line BL1. At this time, a voltage of about 0.0V may be applied to the substrate. However, embodiments of the present disclosure are not limited thereto.

When the voltages are applied to the first word line WL1, the second word line WL2, the first bit line BL1, the second bit line BL2 and the substrate, the electric charge may be trapped in the second transistor TR2. Accordingly, the second sub-memory cell 410b may be programmed.

Next, referring to FIGS. 8 and 14, the voltage may be applied to the word lines and the bit lines in response to a read command for reading the second data stored in the first memory cell 410.

For example, a word line read voltage $V_{RW}$ may be applied to the first word line WL1 and the second word line WL2. A bit line read voltage $V_{RB}$ may be applied to the first bit line BL1 and the second bit line BL2. A source line read voltage $V_{RS}$ may be applied to the source line SL.

In FIG. 8, the word line read voltage $V_{RW}$ may be, for example, about 0.0V or more and about 1.0V or less. The source line read voltage $V_{RS}$ may be, for example, about 0.5V or more and about 1.5V or less. However, embodiments of the present disclosure are not limited thereto.

In this case, a third current $I_3$ may flow through the first bit line BL1. A fourth current $I_4$ may flow through the second bit line BL2. The sense amplifier 500 may receive the third current $I_3$ and the fourth current $I_4$. The sense amplifier 500 may read the second data stored in the first memory cell 410 by comparing the magnitudes of the third current $I_3$ and the fourth current $I_4$. The magnitude of the third current $I_3$ and the magnitude of the fourth current $I_4$ may be different from each other.

For example, when the magnitude of the third current $I_3$ is greater than the magnitude of the fourth current $I_4$, the sense amplifier 500 may read the second data stored in the first memory cell 410.

In some embodiments, the sense amplifier 500 may receive the third bit line voltage from the first bit line BL1, and receive the fourth bit line voltage from the second bit line BL2. The sense amplifier 500 may read the second data stored in the first memory cell 410 by comparing the magnitudes of the third bit line voltage and the fourth bit line voltage.

For example, when the magnitude of the third bit line voltage is greater than the magnitude of the fourth bit line voltage, the sense amplifier 500 may read the second data stored in the first memory cell 410.

Since the first sub-memory cell 410a is erased and the second sub-memory cell 410b is programmed, the sensing margin of the sense amplifier 500 may be increased. Further, according to some embodiments of the present disclosure, the first memory cell 410 and the second memory cell 420 may be fabricated, even when a mask pattern is not added separately.

The memory cell of the non-volatile memory device according to some embodiments may increase the sensing margin of the sense amplifier by operating the first sub-memory cell and the second sub-memory cell in a reverse manner. Accordingly, it is possible to provide a memory device having increased performance and reliability.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

In some embodiments, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In some embodiments, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present disclosure has been particularly shown and described with reference to embodiments thereof, it will be understood by those of ordinary skill in the art that various changes in form and detail may be made therein without departing from the spirit and scope of the present invention as defined by the following claims.

What is claimed is:

1. A non-volatile memory device, comprising:
a memory cell which stores one of first data and second data, and comprises a first sub-memory cell connected to a first word line and a first bit line, and a second sub-memory cell connected to a second word line and a second bit line;
a source line shared by the first sub-memory cell and the second sub-memory cell; and
a sense amplifier connected to the first bit line and the second bit line which reads data stored in the memory cell,
wherein the sense amplifier receives a first current from the first bit line, receives a second current from the second bit line, and reads data stored in the memory cell by comparing magnitudes of the first current and the second current,
the first sub-memory cell is programmed, and the second sub-memory cell is erased, in response to the memory cell storing the first data,
the memory cell is programmed by storing the first data,
a first voltage is applied to the first word line, a second voltage different from the first voltage is applied to the second word line, and the first sub-memory cell is programmed, and
a third voltage different from the first voltage is applied to the first word line, a fourth voltage different from the third voltage is applied to the second word line, and the second sub-memory cell is erased.

2. The non-volatile memory device of claim 1, wherein the first sub-memory cell comprises a first transistor,
the second sub-memory cell comprises a second transistor, and
the first transistor and the second transistor each comprise a high dielectric constant film.

3. The non-volatile memory device of claim 2, wherein the first word line is connected to a gate end of the first transistor, and
the second word line is connected to a gate end of the second transistor.

4. The non-volatile memory device of claim 1, wherein the first voltage is greater than the second voltage, and the third voltage is greater than the fourth voltage.

5. The non-volatile memory device of claim 1, wherein the first sub-memory cell is erased, and the second sub-memory cell is programmed, in response to the memory cell storing the second data.

6. The non-volatile memory device of claim 1, wherein the sense amplifier is not connected to the source line.

7. The non-volatile memory device of claim 1, wherein the first and second sub-memory cells include a multi-time programmable (MTP) memory.

8. The non-volatile memory device of claim 1, wherein when the first current is smaller than the second current, the sense amplifier reads the first data.

9. The non-volatile memory device of claim 1, wherein the source line floats in response to storing of the first data or the second data.

10. A method of operating a non-volatile memory device, wherein the non-volatile memory device includes a memory cell which stores one of first data and second data, and which comprises a first sub-memory cell connected to a first word line and a first bit line and a second sub-memory cell connected to a second word line and a second bit line, a source line shared by the first sub-memory cell and the second sub-memory cell, and a sense amplifier connected to the first bit line and the second bit line which reads data stored in the memory cell, the method comprising:
programming the first sub-memory cell of a memory cell and erasing the second sub-memory cell of the memory cell in response to a command for storing first data in the memory cell,
wherein the programming the first sub-memory cell and the erasing the second sub-memory cell of the memory cell comprise:
applying a first voltage to the first word line and applying a second voltage different from the first voltage to the second word line, such that the first sub-memory cell is programmed; and
applying a third voltage different from the first voltage to the first bit line and applying a fourth voltage different from the third voltage to the second bit line, such that the second sub-memory cell is erased.

11. The method of operating the non-volatile memory device of claim 10, wherein programming the first sub-memory cell comprises grounding the second bit line.

12. The method of operating the non-volatile memory device of claim 10, wherein erasing the second sub-memory cell comprises grounding the first bit line.

13. The method of operating the non-volatile memory device of claim 10, wherein the first sub-memory cell is erased and the second sub-memory cell is programmed, in response to a command for storing the second data by the memory cell.

14. The method of operating the non-volatile memory device of claim 10, further comprising:

receiving a first current or a first bit line voltage from the first bit line;

receiving a second current or a second bit line voltage from the second bit line;

reading any one of the first data and the second data, by comparing magnitudes of the first current and the second current, or by comparing magnitudes of the first bit line voltage and the second bit line voltage.

15. The method of operating the non-volatile memory device of claim 14, wherein when the first current is smaller than the second current, or when the first bit line voltage is smaller than the second bit line voltage, the first data is read.

16. The method of operating the non-volatile memory device of claim 14, wherein when the first current is greater than the second current, or when the first bit line voltage is greater than the second bit line voltage, the first data is read.

17. A method of operating a non-volatile memory device, the method comprising:

applying a read word line voltage to first and second word lines, in response to a read command for reading first data stored in a memory cell, wherein the memory cell stores first data, and comprises a first sub-memory cell connected to the first word line and a first bit line, and a second sub-memory cell connected to the second word line and a second bit line, wherein the first sub-memory cell and the second sub-memory cell share a source line, the first sub-memory cell is programmed, and the second sub-memory cell is erased;

applying a read bit line voltage to the first and second bit lines;

applying a read source line voltage to the source line;

receiving a first current from the first bit line;

receiving a second current from the second bit line; and reading the first data stored in the memory cell by comparing magnitudes of the first current and the second current, wherein the magnitude of the first current is different from the magnitude of the second current, and programming of the first sub-memory cell comprises:

applying a first voltage to the first word line;

applying a second voltage different from the first voltage to the second word line;

applying a third voltage to the first bit line; and applying a fourth voltage different from the third voltage to the second bit line.

18. The method of operating the non-volatile memory device of claim 17, wherein the first current is smaller than the second current.

* * * * *